United States Patent
Li et al.

(10) Patent No.: US 11,991,844 B2
(45) Date of Patent: May 21, 2024

(54) SHAFT AND DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventors: Dengqian Li, Shenzhen (CN); Rong Xia, Shenzhen (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 17/419,546

(22) PCT Filed: May 10, 2021

(86) PCT No.: PCT/CN2021/092695
§ 371 (c)(1),
(2) Date: Jun. 29, 2021

(87) PCT Pub. No.: WO2022/205564
PCT Pub. Date: Oct. 6, 2022

(65) Prior Publication Data
US 2024/0015905 A1 Jan. 11, 2024

(30) Foreign Application Priority Data
Mar. 31, 2021 (CN) .......................... 202110344267.2

(51) Int. Cl.
*H05K 1/02* (2006.01)
*A63F 1/02* (2006.01)
(Continued)

(52) U.S. Cl.
CPC ........ *H05K 5/0217* (2013.01); *H01L 25/0655* (2013.01); *H05K 1/189* (2013.01); *H05K 2201/10128* (2013.01)

(58) Field of Classification Search
CPC .......... H05K 1/02; H05K 1/028; H05K 1/181; H05K 1/189; H05K 5/0017; H05K 5/0217;
(Continued)

(56) References Cited

U.S. PATENT DOCUMENTS 9,992,881 B2 * 6/2018 Choi ...................... H05K 1/028
10,051,728 B2 * 8/2018 Choi ..................... G06F 1/1652
(Continued)

FOREIGN PATENT DOCUMENTS

CN 101681183 A 3/2010
CN 104751739 A 7/2015
(Continued)

*Primary Examiner* — Xiaoliang Chen
(74) *Attorney, Agent, or Firm* — PV IP PC; Wei Te Chung; Zhigang Ma

(57) ABSTRACT

A shaft and a display device are disclosed. The display device includes the shaft including a plurality of planar sections and arc sections. Each of the arc sections is disposed between adjacent ones of the planar sections. A flexible display screen includes a first side, a third side, and a second side sequentially arranged, and the third side is fixed on the shaft. When the flexible display screen is rolled on the shaft, each chip-on-film is placed on a corresponding one of the planar sections, so that a problem that the chip-on-films arranged on the flexible display screen are prone to peel is solved.

11 Claims, 4 Drawing Sheets

(51) Int. Cl.
  *A63F 1/18* (2006.01)
  *H05K 5/02* (2006.01)
  *H05K 5/03* (2006.01)
  *H10K 50/00* (2023.01)
  *H10K 77/00* (2023.01)
  *H01L 25/065* (2023.01)
  *H05K 1/18* (2006.01)

(58) Field of Classification Search
  CPC ............ H05K 5/03; H05K 2201/10128; H01L 25/0655; A63F 1/02; A63F 1/00643; A63F 1/18; A63F 1/1601; A63F 1/1624; A63F 1/1641; A63F 1/1652; G09F 9/301; H10K 50/00; H10K 50/868; H10K 77/00; H10K 77/111
  USPC ............ 361/749, 437, 679.27; 345/173, 174, 345/156, 581, 654
  See application file for complete search history.

(56) References Cited

U.S. PATENT DOCUMENTS

| | | | | |
|---|---|---|---|---|
| 11,013,130 | B2* | 5/2021 | Shin | .......................... H05K 5/03 |
| 2017/0364122 | A1* | 12/2017 | Kim | .......................... G09F 9/301 |
| 2021/0142698 | A1* | 5/2021 | Oh | ....................... H10K 59/871 |
| 2021/0192989 | A1* | 6/2021 | Ahn | ....................... G06F 1/1652 |
| 2021/0343194 | A1* | 11/2021 | Suga | ...................... H05B 33/02 |

FOREIGN PATENT DOCUMENTS

| | | |
|---|---|---|
| CN | 107016937 A | 8/2017 |
| CN | 107484425 A | 12/2017 |
| CN | 107526188 A | 12/2017 |
| CN | 209216463 U | 8/2019 |
| CN | 110233917 A | 9/2019 |
| CN | 110534024 A | 12/2019 |
| CN | 111477110 A | 7/2020 |
| CN | 111640372 A | 9/2020 |
| CN | 111816072 A | 10/2020 |
| JP | 2018132129 A | 8/2018 |
| WO | 2020255426 A1 | 12/2020 |

* cited by examiner

SHAFT AND DISPLAY DEVICE

RELATED APPLICATIONS

This application is a Notional Phase of PCT Patent Application No. PCT/CN2021/092695 having international filing date of May 10, 2021, which claims the benefit of priority of Chinese Patent Application No. 202110344267.2 filed on Mar. 31, 2021. The contents of the above applications are all incorporated by reference as if fully set forth herein in their entirety.

BACKGROUND OF INVENTION

1. Field of Invention

The present invention relates to a technical field of electronic devices, and more particularly to a shaft and a display device.

2. Related Art

Currently, users are relying more and more on electronic products, such as mobile phones, tablets, and smart wearable devices. In order to improve user experience and enhance product competitiveness, the use of large screens has become a development trend. Regarding the inconvenience of carrying large-screen electronic devices, rollable electronic display devices came into being. When not in use, electronic display screens can be rolled on surfaces of shafts for being stored in reduced size, which is convenient to carry. When in use, electronic display screen rolls can be pulled out from the surfaces of the shafts.

When flexible display screens with chip-on-films (COFs) are rolled, since shafts of current rollable devices are solid cylindrical in shape, ends of the flexible display screens are fixed on the shafts, and the shafts rotate to roll up the display screens onto the shafts. Chips on the COFs arranged on sides of the flexible display screens are prone to peel off, and the risk of peeling between the COFs and the flexible display screens also exists. Therefore, it is imperative to carry out a special shaft design for the flexible display screens with the COFs.

SUMMARY OF INVENTION

An object of the present invention is to provide a shaft and a display device to remedy a problem that chips on chip-on-films arranged on sides of flexible display screens in prior art are prone to peel in a rolling process.

An embodiment of the present application provides a display device, comprising a shaft comprising a plurality of planar sections and arc sections, wherein each of the arc sections is disposed between adjacent ones of the planar sections; a flexible display screen comprising a first side, a second side opposite to the first side, and a third side disposed between the first side and the second side, wherein the third side is fixed on the shaft, and the flexible display screen is rollable on the shaft and expandable from the shaft; and a plurality of chip-on-films, wherein at least part of the chip-on-films are spaced apart from each other and disposed on an edge of at least one of the first side, the second side, or the third side; wherein when the flexible display screen is rolled on the shaft, each of the chip-on-films is arranged on a corresponding one of the planar sections.

An embodiment of the present application further provides a shaft, comprising a plurality of planar sections and arc sections, wherein adjacent ones of the planar sections are interconnected with one of the arc sections. The shaft comprises a plurality of protruding platforms disposed on an outer surface of two ends of the shaft, and each of the protruding platforms comprises a plurality of first planar sections and a plurality of first arc sections, wherein adjacent ones of the first planar sections are interconnected with one of the first arc sections, each of the first arc sections has a same diameter, a cross-sectional shape of each of the protruding platforms is polygonal, and/or wherein a second planar section is disposed on one end of one of the arc sections bent inward of the shaft, and an opening is defined by the second planar section and one end of an adjacent one of the planar sections.

The present invention has advantageous effects as follows: in an embodiment of the present application, the shaft is configured as a polyhedral shaft including a plurality of planar surfaces, and a juncture of adjacent ones of the planar surfaces is formed into an arc. By configuring the shaft as a polyhedron, in a rolling process, a chip-on-film (COF) on a side of the flexible display screen is directly and flat rolled on a planar surface, and arc design between the planar surfaces can prevent the COF from being cut, and reduce stress on the COF, thereby remedying a problem that chips on COFs arranged on sides of flexible display screens in prior art are prone to peel in the rolling process.

DESCRIPTION OF PREFERRED EMBODIMENTS

The technical solutions in the embodiments of the present application will be clearly and completely described in the following with reference to the accompanying drawings in the embodiments. Apparently, the embodiments as described are only a part, but not all, of the embodiments of the present application. Based on the embodiments in the present application, all other embodiments obtained by those skilled in the art without creative efforts shall be within the scope of the present application.

Since shaft-type flexible display screens can be rolled on shafts, the flexible display screens can be bent at will. In addition, the shaft-type flexible display screens are light and thin and are more convenient to carry. However, current shafts are cylindrical in shape and have only a single curved surface. The curved surface is a side surface of a cylindrical body. When a flexible display screen provided with a chip-on-film (COF) on a side thereof is rolled on a shaft in a manner of layer-on-layer along the curved surface of the shaft, as number of rolls increases, and pressure resulting from the rolling gradually increases, chips on the COF arranged on the side of the flexible display screen are prone to peel off, and the risk of peeling between the chip-on-film and the flexible display screen also exists.

An embodiment of the present application provides a shaft and a display device. In the present application, the shaft is configured as a polyhedral shaft including a plurality of planar surfaces, and a juncture of adjacent ones of the planar surfaces is formed into an arc. A configuration of the shaft as a polyhedron can reduce a radius of the shaft, which is beneficial for storage of a flexible display screen in a small space, making the display device lighter and thinner, and more convenient to carry. In a rolling process, a COF on a side of the flexible display screen is directly and flat rolled on the planar surface, and arc design between the planar surfaces can prevent the COF from being cut, and reduce stress on the COF, thereby remedying a problem that chips on COFs arranged on sides of flexible display screens in prior art are prone to peel in a rolling process. In the following, with reference to the accompanying drawings, the embodiments of the present application will be described from two aspects of the shaft and the display device.

Figure 1:
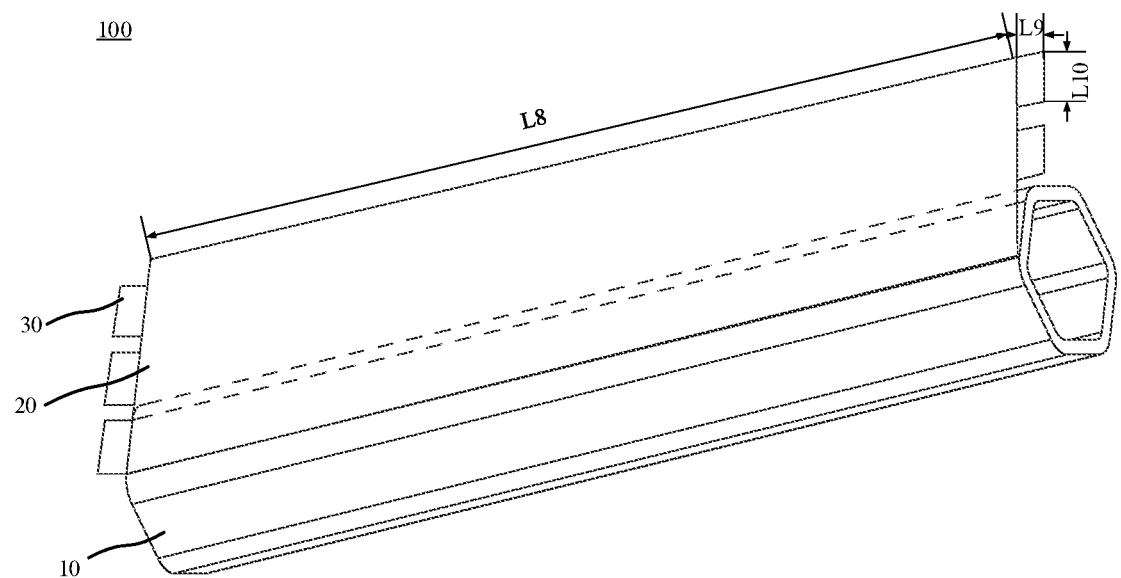
FIG. 1 is a schematic structural view of a rollable display device provided by an embodiment of the present application.
Figure 2:
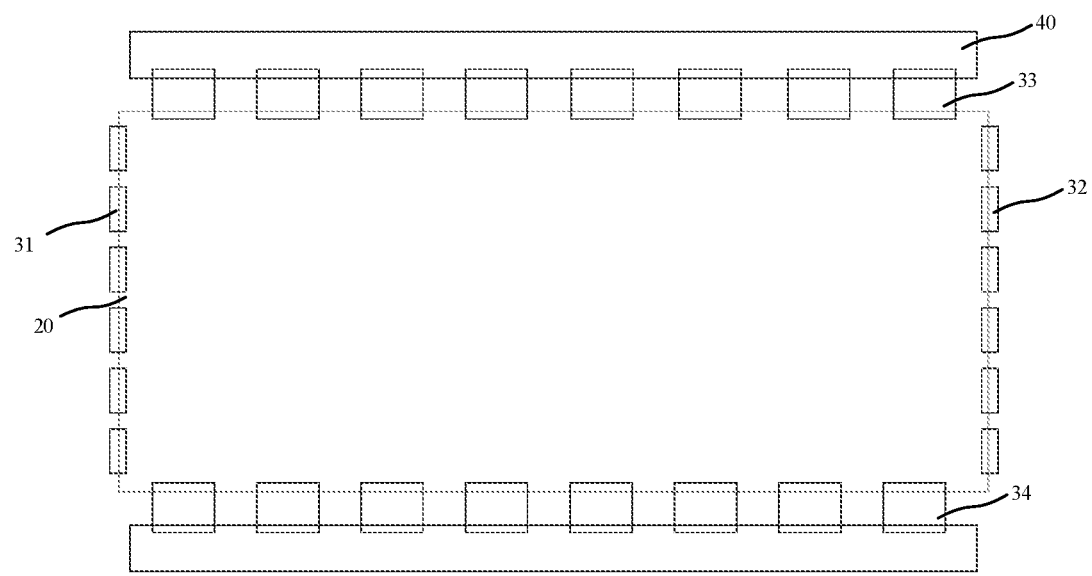
FIG. 2 is a schematic structural view of a flexible display screen and chip-on-films.
Figure 3:
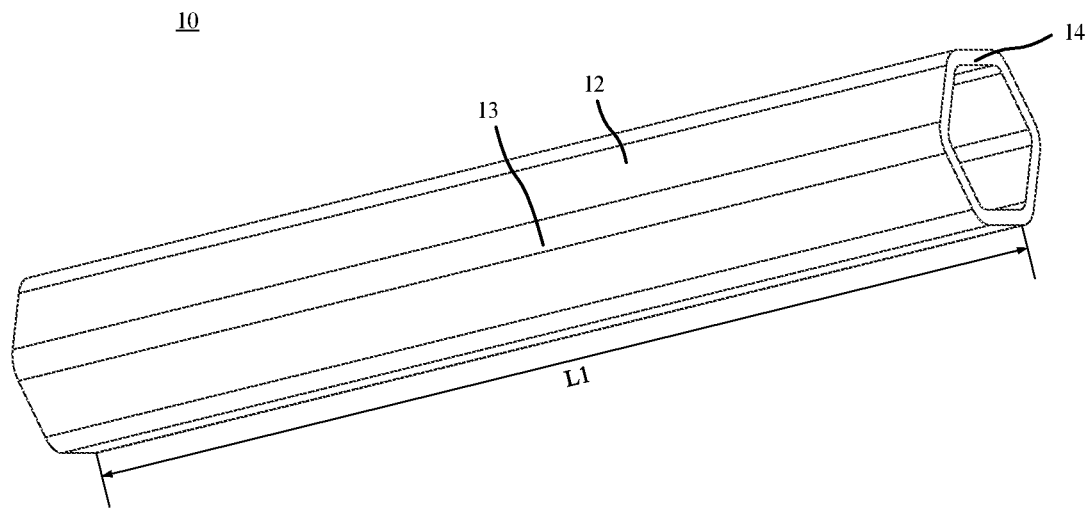
FIG. 3 is a schematic structural view of a shaft provided by the embodiment of the present application.

An embodiment of the present application provides a display device. For details, please refer to FIGS. 1 to 3. FIG. 1 is a schematic structural view of a rollable display device provided by an embodiment of the present application, FIG. 2 is a schematic structural view of a flexible display screen and chip-on-films, and FIG. 3 is a schematic structural view of a shaft provided by the embodiment of the present application. A display device 100 includes a shaft 10, a flexible display screen 20, and a plurality of chip-on-films 30. The flexible display screen 20 includes a first side, a second side opposite to the first side, a third side disposed between the first side and the second side, and a fourth side disposed opposite to the third side, wherein one of the above-mentioned sides is fixed on the shaft 10. Specifically, at least part of the chip-on-films 30 are spaced apart from each other and disposed on an edge of a side of the flexible display screen 20. The shaft 10 includes a plurality of planar sections 12 and arc sections 13. Any adjacent ones of the planar sections 12 are interconnected with one of the arc sections 13. One end of the flexible display screen 20 is fixed to the shaft 10, and the flexible display screen 20 is rollable on the shaft 10 and expandable from the shaft 10. When the flexible display screen 20 is rolled on the shaft 10, each of the chip-on-films 30 is arranged on a corresponding one of the planar sections 12.

By configuring the shaft 10 as a polyhedral shaft 10, the chip-on-films 30 on two sides of the flexible display screen 20 are directly and flat rolled on the planar sections 12, and arc design between the planar surfaces 12 can prevent the chip-on-films 30 from being cut, and reduce stress on the chip-on-films 30, thereby remedying a problem that chips on chip-on-films arranged on sides of flexible display screens in prior art are prone to peel in a rolling process.

The chip-on-films 30 are spaced apart from each other and disposed on a side of the flexible display screen 20. It should be noted that in some embodiments, the chip-on-films 30 can be disposed only on one of the sides of the flexible display screen 20, wherein the one of the sides can be the first side, the second side, the third side, or the fourth side. In some embodiments, the chip-on-films 30 can be disposed on only two of the sides of the flexible display screen 20, wherein the two of the sides can be a combination of any two of the first side, the second side, the third side, or the fourth side. In some embodiments, the chip-on-films 30 can be disposed on three of the sides of the flexible display screen 20, wherein the three of the sides can be a combination of any three of the first side, the second side, the third side, or the fourth side. In some embodiments, the chip-on-films 30 can also be disposed on the four sides of the flexible display screen 20.

Specifically, take the chip-on-films 30 arranged on the four sides of the flexible display screen 20 as an example for description. The chip-on-films 30 include a plurality of first chip-on-films 31 disposed on the first side, a plurality of second chip-on-films 32 disposed on the second side, a plurality of third chip-on-films 33 disposed on the third side, and a plurality of fourth chip-on-films 34 disposed on the fourth side of the flexible display screen 20. The first chip-on-films 31 and the second chip-on-films 32 are symmetrically distributed on two sides of the flexible display screen 20. The third chip-on-films 33 and the fourth chip-on-films 34 are symmetrically distributed on two ends of the flexible display screen 20. It should be noted that in some embodiments, one or more of the first chip-on-films 31, the second chip-on-films 32, the third chip-on-films 33, or the fourth chip-on-films 34 may not be included on the sides of the flexible display screen 20. It is only necessary to ensure that there is one kind of the chip-on-films 30 arranged on at least one of the sides of the flexible display screen 20.

The shaft 10 includes the planar sections 12 and the arc sections 13, and any adjacent ones of the planar sections 12 are interconnected with one of the arc sections 13. The planar sections 12 and the arc sections 13 are enclosed to form the shaft 10 with a hollow structure. It can be understood that the shaft 10 with the hollow structure has a chamber. A number of the planar sections 12 is greater than or equal to two. In some embodiments, common sides of each of the planar sections 12 and an adjacent one of the arc sections 13 are parallel to each other, and two ends of the shaft 10 are parallel to each other. In some embodiments, the planar sections 12 are of a same size and shape. It should be noted that the planar sections 12 may be different from each other. In some embodiments, the arc sections 13 are of a same arc distance, size, and arc angle. It should be noted that the arc sections 13 may be different from each other.

Each of the planar sections 12 of the shaft 10 has a length equal to a length of the first chip-on-film 31 placed on the planar section 12 and a length of the second chip-on-film 32 placed on the planar section 12. It can be understood that in some embodiments, a length L1 of the planar section 12 of the shaft 10 is greater than a length L10 of the first chip-on-film 31 and a length L10 of the second chip-on-film 32 placed on the planar section 12. The length L10 of the first chip-on-film 31 is the same as a spacing between adjacent ones of the arc sections 13, and each of the arc sections 13 has an arc distance L3 equal to a spacing between adjacent ones of the first chip-on-films 31. It can also be understood that each of the chip-on-films 30 arranged on the two sides of the flexible display screen 20 is located between adjacent ones of the arc sections 13. Specific configurations are designed according to actual needs, and an only requirement is that each one of the first chip-on-films 31 and each one of the second chip-on-films 32 are evenly arranged on the planar sections 12. By arranging the first chip-on-films 31 and the second chip-on-films 32 evenly on the planar sections 12, the first chip-on-films 31 and the second chip-on-films 32 arranged on the two sides of the flexible display screen 20 are flat placed on the planar sections 12 of the shaft 10 when rolling the flexible display screen 20, so that no curling deformation occurs in the chip-on-films 30, thereby reducing stress on the chip-on-films 30 and remedying a chip peeling problem caused by excessive stress near the chip-on-films 30.

Figure 4:
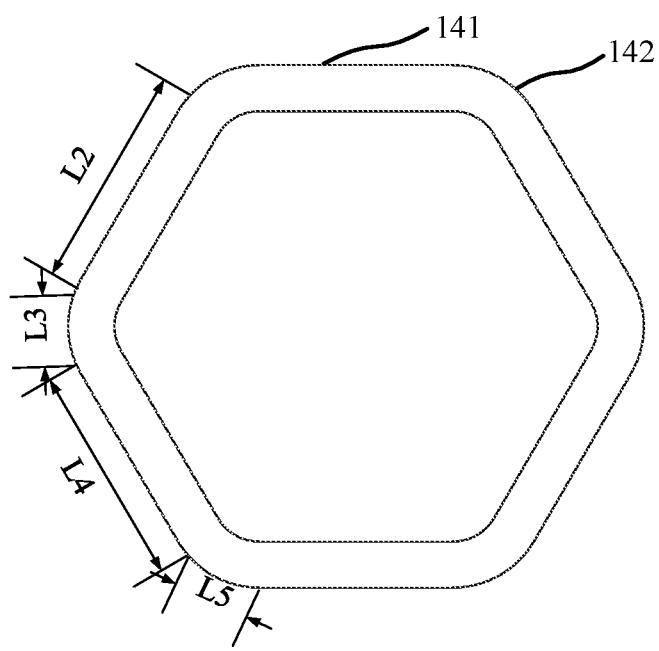
FIG. 4 is a schematic cross-sectional view of the shaft provided in FIG. 3.

Please further refer to FIG. 4, which is a schematic cross-sectional view of the shaft provided in FIG. 3. In some embodiments, the cross-sectional shape of the shaft 10 is a polygonal shape 14. The cross-section of the shaft body 10 includes six first straight-line sections 141 and six first arc sections 142. A length L2 of one of the first straight-line sections 141 of the polygonal shape 14 is equal to a length L2 of another one of the first straight-line sections 141. An arc distance L3 of one of the first arc sections 142 is equal to an arc distance L3 of another one of the first arc sections 142. The six first straight-line sections 141 and the six first arc sections 142 are sequentially connected to form a closed annular shape. Adjacent ones of the first straight-line sections 141 of the polygonal shape 14 are interconnected with one of the first arc sections 142. In some embodiments, a length L2 of one of the first straight-line sections 141 of the polygonal shape 14 is equal to a length L4 of another one of the first straight-line sections 141, an arc distance L3 of one of the first arc sections 142 is equal to an arc distance L5 of another one of the first arc sections 142, and a center of each of the first arc sections 142 intersects at one point.

It should be noted that number of the first straight-line sections 141 of the polygonal shape 14 can be greater than number of the first chip-on-films 31 disposed on the two sides of the flexible display screen 20. In some embodiments, number of the first straight-line sections 141 of the polygonal shape 14 can be greater than number of the first chip-on-films 31 disposed on the two ends of the flexible display screen 20. A specific number of the first straight-line sections 141 of the polygonal shape 14 is determined according to how many of the chip-on-films 30 disposed on one side of the flexible display screen 20 are in actual products. For example, if a product has 10 chip-on-films 30 in a rolling direction, the shaft 10 is designed to be greater than or equal to a decahedron.

In a rolling direction, if the flexible display screen 20 is provided with the chip-on-films 30, it generally cannot be bent, otherwise the chip-on-films 30 may be broken or separated from the flexible display screen 20 due to rolling. Current shafts are generally cylindrical in shape. If a bending radius of the shaft is set to be R1000 or more, as a great curvature, to reduce adverse influence brought about by bending on the chip-on-films, the chip-on-films 30 will not be affected. However, in doing so, the radius of R1000 would be too large. The present invention is to form the shaft 10 with the planar sections 12 and the arc sections 13, and adjacent ones of the planar sections 12 are interconnected with one of the arc sections 13. A radius R of the shaft 10, as the polyhedral shaft 10, designed in this way can be about R100-R200, which facilitates a smallest radius of the shaft 10, and is convenient for storage of the shaft 10 in a small space.

The length L1 of the planar section 12 of the shaft 10 should be greater than or equal to an external length L8 of the flexible display screen 20. Specifically, when the length L1 of the shaft 10 is greater than the length L8 of the flexible display screen 20, the first chip-on-film 31 and the second chip-on-film 31 are not bonded. The first chip-on-film 31 and the second chip-on-film 32 are placed flat on an outer surface of the shaft 10 when rolling the flexible display screen 20, and a distance between a furthermost side of the first chip-on-film 31 and a furthermost side of the second chip-on-film 32 is equal to the length L1 of the shaft 10. That is, the length L1 of the shaft 10 is equal to the length L8 of the flexible display screen 20 plus a width L9 of the first chip-on-film 31 and a width L9 of the second chip-on-film 32. In some embodiments, when the length L1 of the shaft 10 is equal to the length L8 of the flexible display screen 20, the first chip-on-film 31 and the second chip-on-film 32 are disposed by bonding in a hollow structure enclosed by the planar sections 12 and the arc surfaces 13, so that the first chip-on-film 31 and the second chip-on-film 32 are hidden on inner sides of the shaft 10, and a frame size can be reduced.

A width L2 of the planar section 12 of the shaft 10 should be equal to the length L10 of the first chip-on-film 31 and/or the length L10 of the second chip-on-film 32. A length L3 of the arc section 13 should be equal to the spacing between any adjacent ones of the first chip-on-films 31.

A flexible circuit board 40 is provided on a side of the third chip-on-films 33 away from the flexible display screen 20 and a side of the fourth chip-on-films 34 away from the flexible display screen 20. The flexible circuit board 40 and a hexahedral shaft 10 are fixed to each other by physical connection methods such as double-sided tape/screwing. The flexible circuit board 40 can be fixed on any planar section 12 of the outer surface of the shaft 10. By fixing one end of the flexible circuit board 40 to one end of the shaft the other end of the flexible display screen 20 can be rolled on the shaft and expanded from the shaft 10, so as to enable the display device 100 to be rolled on the outer surface of the shaft 10 and to be stored in reduced size for convenient carrying. When in use, an electronic display screen roll can be pulled out from the surface of the shaft 10.

Figure 5:
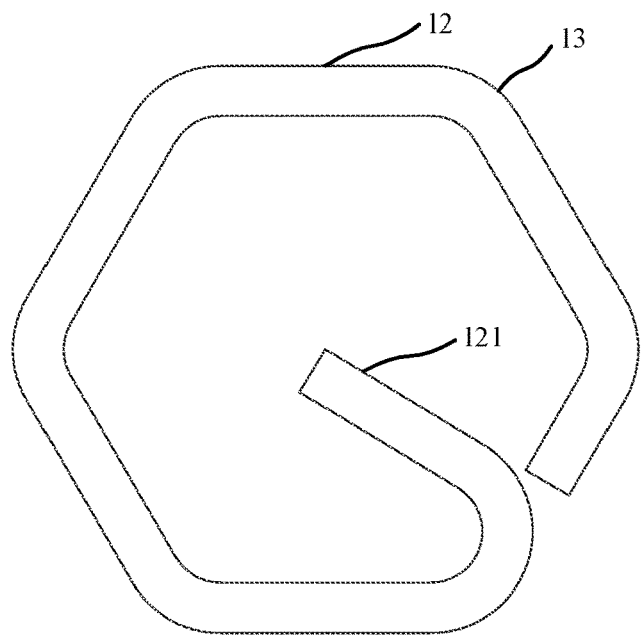
FIG. 5 is a schematic cross-sectional view of another shaft provided by an embodiment of the present application.

In some embodiments, the cross-sectional shape of the shaft 10 is not closed polygonal. For details, please further refer to FIG. 5, which is a schematic cross-sectional view of another shaft provided by an embodiment of the present application. The planar sections 12 and the arc sections 13 of the shaft 10 are sequentially connected to each other. A second planar section 121 is disposed on one end of one of the planar sections 12 bent inward of the shaft 10, and an opening is formed by the second planar section 121 and one end of an adjacent one of the planar sections 12. It can be understood that the planar sections 12, the arc sections 13, and the second planar section 121 are integrally formed. The flexible circuit board 40 is fixed to the second planar section 121 by screwing or adhering, and the opening is configured for insertion of the flexible circuit board 40. It should be noted that the second planar section 121 and the planar section 12 are connected with an arc section or a rounded corner, so that the flexible circuit board 40 and the chip-on-films 30 disposed on the flexible display screen 20 can be prevented from being scraped by the shaft 10 when moving out from the opening. Different fixed positions of the flexible circuit board 40 have different effects on flatness of the flexible display screen 20, and the flexible display screen 20 fixed inside the shaft 10 is better than fixed on the outer surface of the shaft 10. By fixing the flexible circuit board 40 inside the shaft 10, the flexible display screen 20 will not interfere with the flexible circuit board 40, so that the flatness will not be affected. In some embodiments, the flexible circuit board 40 fixed on the shaft 10 will interfere with the flexible display screen 20 and will cause adverse effects on the flatness.

Figure 6:
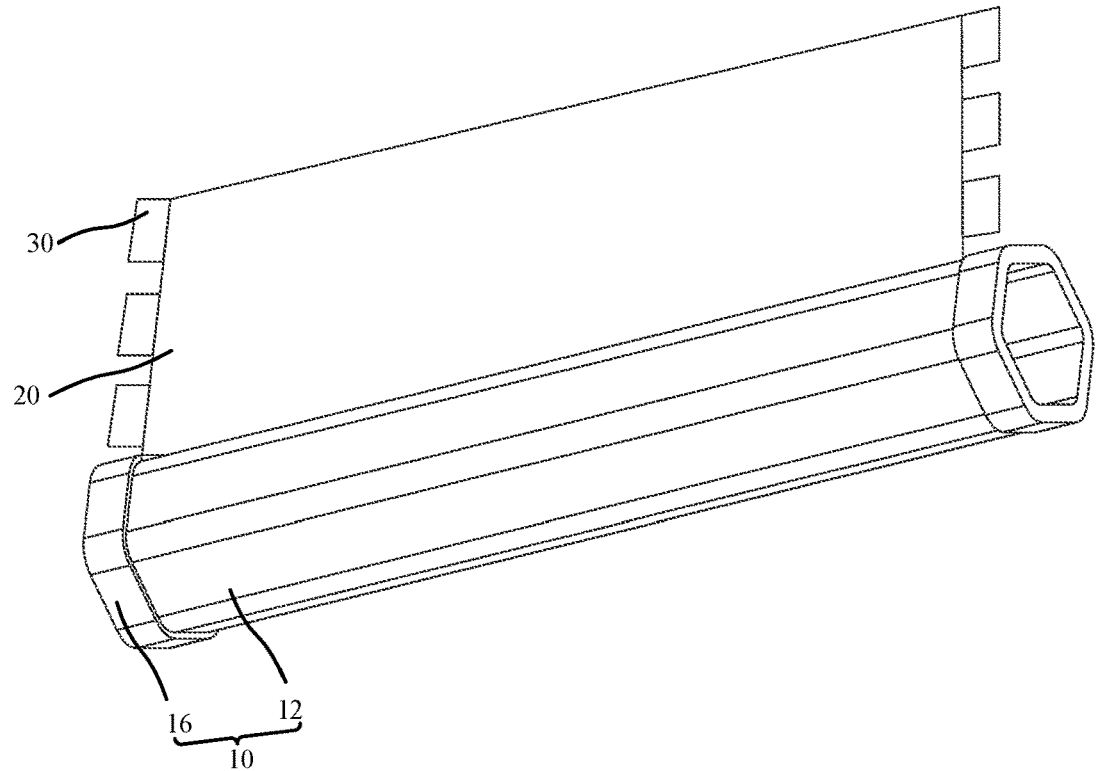
FIG. 6 is a schematic structural view of another rollable display device provided by an embodiment of the present application.
Figure 7:
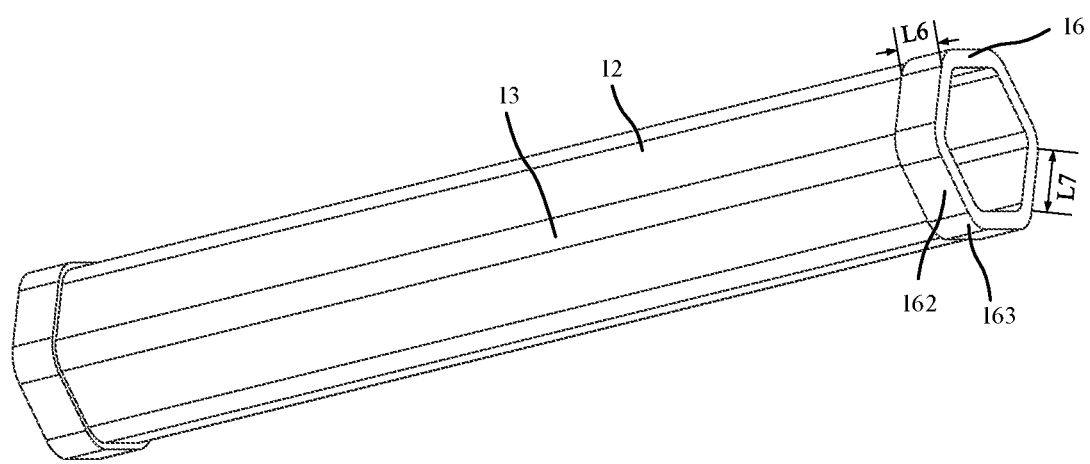
FIG. 7 is a schematic structural view of another shaft provided by an embodiment of the present application.

In some embodiments, please refer to FIG. 6 in combination with FIG. 7. FIG. 6 is a schematic structural view of another rollable display device provided by an embodiment of the present application, and FIG. 7 is a schematic structural view of another shaft provided by the embodiment of the present application. The shaft 10 has a main body which is a smooth polyhedral structure. A plurality of protruding platforms 16 having a same size as each other are disposed on an outer surface of two ends of the shaft 10. Each of the protruding platforms 16 includes a plurality of first planar sections 162 and second arc sections 163. Adjacent ones of the first planar sections 162 are interconnected with one of the second arc sections 163, each of the second arc sections 163 has a same diameter, and a cross-sectional shape of each of the protruding platforms 162 is a first polygonal shape. The first polygonal shape has a plurality of second straight-line sections, and adjacent ones of the second straight-line sections are interconnected with a third arc section. In some embodiments, the first planar sections 162 are of a same size and shape. It should be noted that the first planar sections 162 may be different from each other. In some embodiments, the second arc sections 163 are of a same arc distance, size, and arc angle. It should be noted that the second arc sections 163 may be different from each other.

The main body of the shaft 10 includes the planar sections 12 and the arc sections 13. Any adjacent ones of the planar sections 12 are interconnected with one of the arc sections 13. The planar sections 12 and the arc sections 13 are enclosed to form the shaft 10 with the hollow structure. The cross-sectional shape of the main body of the shaft 10 is the polygonal shape 14. The polygonal shape 14 includes the first straight-line sections 141 and first arc sections 142, and adjacent ones of the first straight-line sections 141 are interconnected with one of the first arc sections 142.

Number of sides of the first polygonal shape is equal to number of sides of the polygonal shape 14, and a length of each of the second straight-line sections of the first polygonal shape is equal to the length of each of the first straight-line sections 141 of the polygonal shape 14. As shown in FIGS. 4 and 7, a length L2 of the second straight-line section of the first polygonal shape is equal to a length L7 of the first straight-line section 141 of the polygonal shape 14. Each of the third arc sections has a same diameter, and an arc distance of the third arc section is equal to the arc distance of the second arc section 163.

The main body of the shaft 10 is polyhedral in shape, and the length L1 of the shaft 10 should be greater than or equal to the external length L8 of the flexible display screen 20, wherein specific situations are described above, which are not repeated here. A length of each of the protruding platforms 16 of the polyhedral shaft 10 disposed on edges of two sides of the shaft 10 should be greater than or equal to a width of each of the chip-on-films. Specifically, based on a length L6 of the protruding platform 16 of the polyhedral shaft 10 being greater than the width L9 of the first chip-on-film 31 or the width L9 of the second chip-on-film 32, the first chip-on-film 31 or the second chip-on-film 32 can be fully and flat placed on the first planar section 162 of the protruding platform 16 when the flexible display screen 20 is rolled on the shaft 10. In this manner, it not only can reduce excessive stress on the chip-on-films 30, but can also help with the design of reducing a radius of the shaft 10. A width L7 of each of the polyhedral first planar sections 162 should be equal to the length L10 of the first chip-on-film 31 or the length L10 of the second chip-on-film 32. An arc distance L3 of each of the second arc sections 13 should be equal to the spacing between adjacent ones of the first chip-on-films 31 or a spacing between adjacent ones of the second chip-on-films 32.

In practical applications, because the chip-on-films 30 are bonded to the flexible display screen 20, and a side of the flexible display screen 20 away from the first chip-on-film 31 is provided with a backplate, the backplate and the flexible display screen 20 are attached to each other. In order to facilitate placement of the first chip-on-film 31 and the second chip-on-film 32 on the polyhedral protruding platforms 16, each of the polyhedral protruding platforms 16 located at two sides of the shaft 10 should have a height equal to a sum of thickness of the flexible display screen 20 and thickness of the backplate (BP). In this manner, it can be ensured that a lowermost surface of each of the chip-on-films 30 is exactly placed on upper surfaces of the protruding platforms 16, so that the chip-on-films 30 will not be suspended.

By providing the protruding platforms 16 on two ends of the shaft 10, when the flexible display screen 20 configured with the chip-on-films 30 on four sides thereof is being rolled, the protruding platforms 16 can support the chip-on-films 30, making the chip-on-films 30 not be suspended, thereby further preventing situations including peeling between the chip-on-films 30 and the flexible display screen 20, and peeling of or damage to chips on the chip-on-films 30, from occurring.

In the above-mentioned embodiments, the description of each embodiment has its own emphasis. For parts that are not described in detail in an embodiment, please refer to the relevant description of other embodiments.

The shaft and the display device provided by the embodiments of the present application are described in detail above. Specific examples are used in this article to explain the principles and implementation of this application. The descriptions of the above embodiments are only used to help understand the technical solutions and core ideas of this application. Also, for those skilled in the art, according to the idea of this application, there will be changes in the specific implementation and application scope. In summary, the content of this application should not be construed as a limitation on this application.

What is claimed is:

1. A display device, comprising:
   a shaft comprising a plurality of planar sections and arc sections, wherein each of the arc sections is disposed between adjacent ones of the planar sections:
   a flexible display screen comprising a first side, a second side opposite to the first side, and a third side disposed between the first side and the second side, wherein the third side is fixed on the shaft, and the flexible display screen is rollable on the shaft and expandable from the shaft; and
   a plurality of chip-on-films, wherein at least part of the chip-on-films are spaced apart from each other and disposed on an edge of at least one of the first side, the second side, or the third side;
   wherein when the flexible display screen is rolled on the shaft, each of the chip-on-films is arranged on a corresponding one of the planar sections.

2. The display device of claim 1, wherein the chip-on-films comprise a plurality of first chip-on-films disposed on the first side, and a plurality of second chip-on-films disposed on the second side, wherein when the flexible display screen is rolled on the shaft, each of the first chip-on-films and each of the second chip-on-films are arranged on the planar sections, and the first chip-on-films and the second chip-on-films are symmetrically distributed on two sides of the flexible display screen, wherein each of the first chip-on-films has a length equal to a spacing between adjacent ones of the arc sections, and each of the arc sections has an arc distance equal to a spacing between adjacent ones of the first chip-on-films.

3. The display device of claim 2, wherein a number of the planar sections is equal to a number of the first chip-on-films and is greater than or equal to two.

4. The display device of claim 2, wherein the shaft has a length greater than a length of the flexible display screen, and the first chip-on-films and the second chip-on-films are rolled on an outer surface of the shaft.

5. The display device of claim 4, wherein a distance between a side of each of the first chip-on-films away from the flexible display screen and a side of each of the second chip-on-films away from the flexible display screen is equal to the length of the shaft.

6. The display device of claim 2, wherein a hollow structure is defined by the planar sections and the arc sections of the shaft, the shaft has a length equal to a length of the flexible display screen, and the first chip-on-films and the second chip-on-films are disposed in the hollow structure by bonding.

7. The display device of claim 1, wherein the shaft comprises a plurality of protruding platforms disposed on an outer surface of two ends of the shaft, and each of the protruding platforms comprises a plurality of first planar sections and a plurality of first arc sections, wherein adjacent ones of the first planar sections are interconnected with one of the first arc sections, each of the first arc sections has a same diameter, and a cross-sectional shape of each of the protruding platforms is polygonal.

8. The display device of claim 7, further comprising a backplate attached to a side of the flexible display screen away from first chip-on-films included in the chip-on-films, and each of the protruding platforms has a height equal to a sum of thickness of the flexible display screen and thickness of the backplate.

9. The display device of claim 8, wherein the protruding platforms each have a length greater than or equal to a width of each of the first chip-on-films.

10. The display device of claim 1, wherein the planar sections and the arc sections are sequentially and fixedly connected to each another, and the display device further comprises a flexible circuit board disposed on any one of the planar sections of the shaft.

11. The display device of claim 1, wherein a second planar section is disposed on one end of one of the arc sections bent inward of the shaft and is configured to fix a flexible circuit board, wherein an opening is defined by the second planar section and one end of an adjacent one of the planar sections and is configured for insertion of the flexible circuit board.

* * * * *